US010025890B2

(12) United States Patent
Minassian et al.

(10) Patent No.: US 10,025,890 B2
(45) Date of Patent: Jul. 17, 2018

(54) PHASE NOISE SIMULATION MODEL FOR PULSE DOPPLER RADAR TARGET DETECTION

(71) Applicants:Advanced Testing Technologies, Inc., Hauppauge, NY (US); Eli Levi, Dix Hills, NY (US)

(72) Inventors: Shahen Minassian, Dix Hills, NY (US); John L Baker, South Setauket, NY (US); Eli Levi, Dix Hills, NY (US)

(73) Assignee: Advanced Testing Technologies, Inc., Hauppauge, NY (US)

( * ) Notice: Subject to any disclaimer, the term of this patent is extended or adjusted under 35 U.S.C. 154(b) by 415 days.

(21) Appl. No.: 14/796,797

(22) Filed: Jul. 10, 2015

(65) Prior Publication Data

US 2016/0012164 A1    Jan. 14, 2016

Related U.S. Application Data

(60) Provisional application No. 62/023,362, filed on Jul. 11, 2014.

(51) Int. Cl.
*G06F 7/60* (2006.01)
*G06F 17/10* (2006.01)
(Continued)

(52) U.S. Cl.
CPC ............ *G06F 17/5009* (2013.01); *G01S 7/40* (2013.01); *G01S 13/5244* (2013.01)

(58) Field of Classification Search
None
See application file for complete search history.

(56) References Cited

U.S. PATENT DOCUMENTS

| 4,450,446 A | * | 5/1984 | Clancy ............... G01S 13/5244 342/159 |
| 4,746,922 A | | 5/1988 | Prenat |

(Continued)

OTHER PUBLICATIONS

Li, Zhixi et al. "Doppler Visibility of Coherent Ultrawideband Random Noise Radar Systems", Jul. 2006, IEEE Transactions on Aerospace and Electronic Systems, vol. 42, No. 3, IEEE. (Year: 2006).*

(Continued)

*Primary Examiner* — Cedric Johnson
(74) *Attorney, Agent, or Firm* — Brian Roffe (57) ABSTRACT

Method for generating a model of the effect of phase noise during use of a Doppler radar system including calculating, using a processor, an initial signal-to-clutter ratio (SCR) representing a ratio of power received from echoes from a target by the radar system to power resulting from clutter reflection received by the radar system. The initially calculated SCR is modified as a function of a range ambiguity and range resolution. A Doppler frequency of interest is calculated based on velocity of a target, target heading and radar frequency, along with a Doppler filter bandwidth, frequency components and a measure of clutter signal passing through the Doppler filter of interest by summing products of the phase noise for each frequency by the Doppler filter bandwidth. This measure indicates effectiveness of target detection by the Doppler radar system as a function of distance.

20 Claims, 5 Drawing Sheets

(51) Int. Cl.
    *G06F 17/50*     (2006.01)
    *G01S 7/40*     (2006.01)
    *G01S 13/524*     (2006.01)

(56) References Cited

U.S. PATENT DOCUMENTS

| | | | |
|---|---|---|---|
| 4,806,932 A * | 2/1989 | Bechtel | G01S 7/40 342/10 |
| 4,891,649 A | 1/1990 | Labaar et al. | |
| 4,914,441 A | 4/1990 | Brookner | |
| 5,173,706 A * | 12/1992 | Urkowitz | G01S 7/032 342/101 |
| 5,422,829 A * | 6/1995 | Pollock | G01S 13/58 342/133 |
| 5,465,095 A | 11/1995 | Bryant | |
| 5,644,315 A | 7/1997 | Long | |
| 5,808,580 A | 9/1998 | Andrews | |
| 5,831,570 A * | 11/1998 | Ammar | F41G 7/2226 342/26 B |
| 6,049,302 A | 4/2000 | Hinckey, Jr. | |
| 6,184,820 B1 | 2/2001 | Kratzer | |
| 6,380,887 B1 | 4/2002 | Suen | |
| 6,518,917 B1 | 2/2003 | Durfee et al. | |
| 6,809,681 B1 | 10/2004 | Niechayev | |
| 7,548,187 B1 | 6/2009 | Laste et al. | |
| 2007/0058157 A1 | 3/2007 | Deines | |
| 2009/0066562 A1 | 3/2009 | Altes | |
| 2010/0158152 A1 | 6/2010 | Edwards | |
| 2010/0321234 A1 * | 12/2010 | Goldman | G01S 13/9029 342/25 A |
| 2012/0242536 A1 | 9/2012 | Palevsky | |
| 2013/0099943 A1 * | 4/2013 | Subramanya | G01S 7/2926 340/933 |
| 2013/0169473 A1 | 7/2013 | Gallone et al. | |
| 2013/0181860 A1 | 7/2013 | Le et al. | |
| 2014/0097980 A1 | 4/2014 | Campbell | |
| 2014/0333475 A1 | 11/2014 | Sierwald | |
| 2015/0070207 A1 | 3/2015 | Millar et al. | |

OTHER PUBLICATIONS

Budge, Mervin C. Jr., et al., "The Effects of an ADC on SCR Improvement", Oct. 2013, IEEE Transactions on Aerospace and Electronic Systems, vol. 49, No. 4, IEEE. (Year: 2013).*

International Search Report and Written Opinion, including search history, for PCT/US2015/40182 dated Mar. 10, 2016.

* cited by examiner

PHASE NOISE SIMULATION MODEL FOR PULSE DOPPLER RADAR TARGET DETECTION

CROSS-REFERENCE TO RELATED APPLICATION

This application claims priority under 35 U.S.C. § 119(e) of U.S. provisional patent application Ser. No. 62/023,362 filed Jul. 11, 2014, now expired, which is incorporated by reference herein.

FIELD OF THE INVENTION

The present invention relates generally to computer simulation and modeling of phase noise within a pulse Doppler radar target system and the effect it has with respect to overall system performance.

The present invention also relates to a method for generating a model of phase noise with a pulse Doppler radar target system and using the generated model.

The present invention also relates to a method for designing, configuring or analyzing a pulse Doppler radar system to obtain a more accurate radar response by reducing the effect of clutter return via appropriate selection of the components of the radar system and analysis of the operation of various configurations of radar components relative to clutter.

BACKGROUND OF THE INVENTION

Pulse Doppler radar detects a target in the presence of background clutter by the Doppler frequency offset induced by its radial velocity. This is accomplished by sending short bursts of microwave or radio frequency (RF) signals and collecting the echoes received. The ensemble of received signals is processed using fast Fourier Transforms (FFT). This process determines the frequency domain of the signals in those pulses. The process separates a moving target from higher amplitude stationary clutter in the frequency domain. This provides the system designer with a reasonable probability of detection in a clutter environment.

OBJECTS AND SUMMARY OF THE INVENTION

An object of at least one embodiment of the present invention is to provide radar system designers a method for calculating radar system performance based on relevant radar system parameters in conjunction with phase noise at various carrier offset frequencies.

A computer modeling system that analyzes the effect of phase noise present in the microwave or radio frequency (RF) signals on radar system performance using parameters input into a computer program in accordance with the invention.

Phase noise has a significant impact on radar target detection, yet its impact is not always clearly understood by radar system operators and maintainers other than knowing that low system phase noise within a radar system is critical to mission capability. Through the use of simulation modeling, the effects and correlation of the phase noise on a pulse Doppler radar for a specified Constant False Alarm Rate (CFAR) can be calculated. This calculation may be used to modify the operation of the radar system, possibly by configuring the radar system in light of the modeling or notifying personnel monitoring the radar system of its operational limitations. This notification may be made via the radar system itself, i.e., the radar system would indicate visually or audibly when its operation is compromised by the presence of excessive phase noise that cannot be electronically suppressed.

A method for designing a Doppler radar system in accordance with the invention includes configuring a first set of components that enable operation of the radar system, generating a first model of the effect of phase noise during use of the radar system configured with the first set of the components, changing the radar system by configuring a second set of the components that enable operation of the radar system, which second set of components is different than the first set of components, generating a second model of the effect of phase noise during use of the radar system configured with the second set of the components, and then analyzing the first and second models to determine which of the first and second sets of components has a lower effect of phase noise during use of the radar system. The first or second set of components is operationally used depending on the analysis of which of the first and second models has a lower effect of phase noise during use of the radar system.

In the design of an optimal radar system, a plurality of components required for operation of the radar system are identified, e.g., a frequency generator or oscillator, a frequency scanning antenna, a receiver configured to receive clutter and signals from a target and a signal processor that utilizes a plurality of Doppler filters. For one or more of the identified components, two or more of the same type of component are obtained, which have the same function but interact with the remaining components to provide a different operation of the radar system. For example, two different oscillators may be obtained. A model is obtained for one set of components with one oscillator and then for another set of components including the other oscillator. The respective models are analyzed to determine which oscillator causes a lower effect of phase noise during use of the radar system, and then this oscillator may operatively be used in the final designed radar system.

Often there are times where existing radar systems, designed many years earlier, are still actively used and maintained. The users and/or maintainers of these radar systems may not know overall system phase noise specifications or what specifications are critical to achieve the desired operational performance. The invention disclosed herein may also be used to analyze an existing radar (post design phase) to determine system phase noise specifications necessary to operate within various theatres (rolling hills, desert, heavily wooded forest, sea, etc.) to achieve expected target detection distances.

The invention will be described in detail with reference to some preferred embodiments of the invention illustrated in the figures in the accompanying drawings. However, the invention is not confined to the illustrated and described embodiments alone.

BRIEF DESCRIPTION OF THE DRAWINGS

Additional objects of the invention will be apparent from the following description of the preferred embodiment thereof taken in conjunction with the accompanying non-limiting drawings, in which.

DETAILED DESCRIPTION OF THE INVENTION

Pulse Doppler signal processing generally involves implementing the FFT algorithm in a signal processor, which develops a bank of filters, extending from −PRF/2 to +PRF/2 (PRF being the pulse repetition frequency). The target velocity determines the Doppler bin in which the target will be found. The stationary surface clutter (land or sea) will be in a different Doppler filter, so the target and clutter can be separated, even though the clutter signal may be much larger than the target signal (see FIG. 1). Not only does the Doppler filter allow the system to separate low velocity returns, which include most ground and sea clutter, but the system can also determine the target velocity. The received signal from each bin is collected and placed into a matrix for processing through the appropriate signal processing conditions and the results presented to an operator of the radar system. The system of Doppler filter bins and constant false alarm rate (CFAR) adaptive thresholds determine whether a target is detected and presented to the operator, or suppressed as clutter signal. For a target to have a high probability of detections, say 90%, the required residual signal to clutter ratio after processing is typically 20 dB or higher.

Generally, the radar analysis techniques disclosed herein are applicable to a radar system that is effected by clutter or noise caused by the ground. Thus, particular radar systems to which the invention may be applied are airborne systems that direct radar waves at the level of flight and below, as well as ground-based radar systems that direct radar at the same level.

Figure 1:
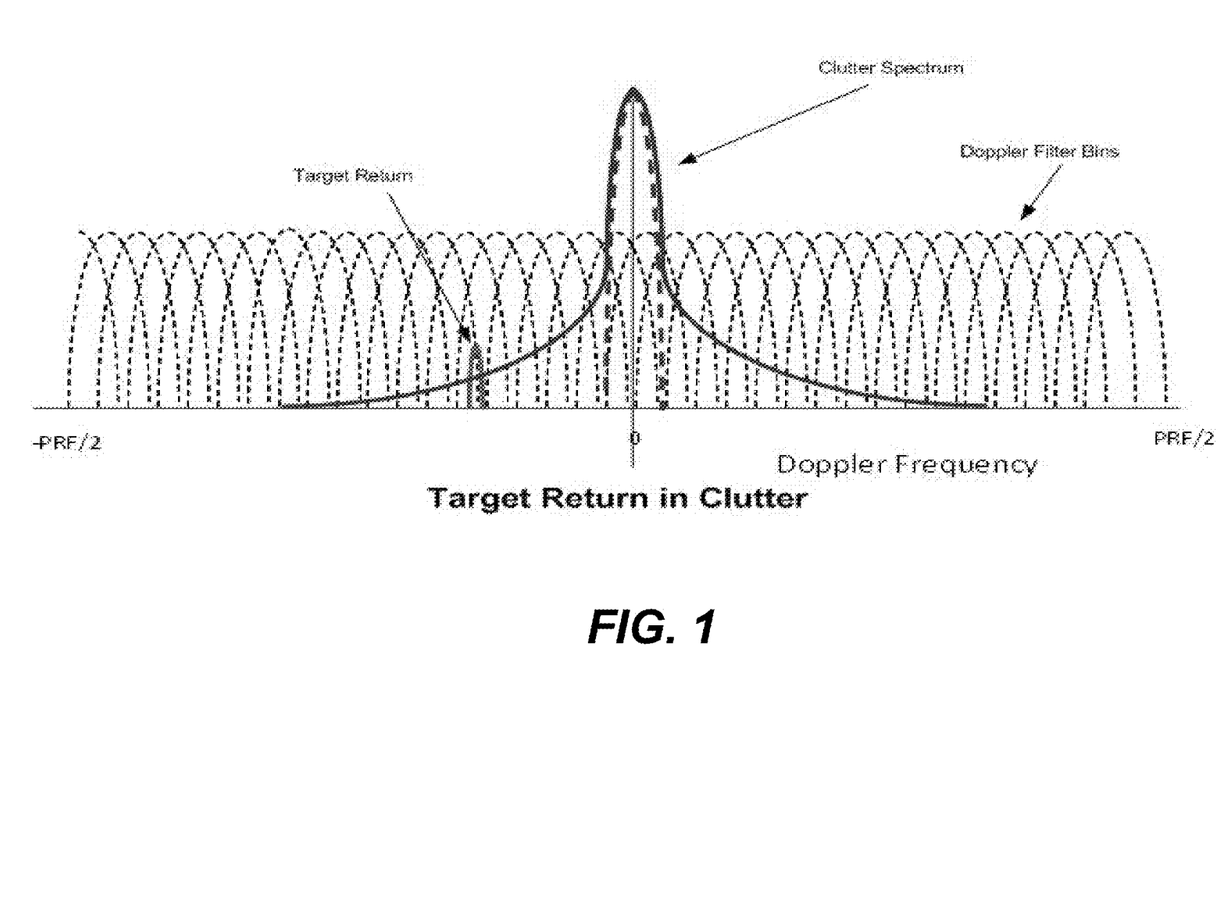
FIG. 1 reflects typical target return in clutter.

The magnitude of the clutter return is generally much higher than that of the target. FIG. 1 illustrates how clutter power affects target detection. In the case of a range-ambiguous system, this effect is worse, because a close-in clutter signal will appear in the same range bin as a far-away target. The Doppler filters separate the return target and clutter spectrum into the various frequency bins. However, due to the spectral impurity imparted on the received clutter by phase noise, the clutter power spreads into the adjacent Doppler bins. The clutter power present in the target's Doppler filter bin competes with the target in the Radar's detection processor. Because radars employ CFAR processing to continually adjust the detection threshold, the clutter that resides in the Doppler bin with target returns impacts the detection. Phase noise present in the radar system contributes significantly to the power present in the 'skirts' of the clutter return power spectrum, causing the CFAR to establish higher thresholds. This results in the target being suppressed by the Radar Signal Processor.

In FIG. 1, the bold dashed line represents the natural clutter spectrum, and the bold solid line represents the clutter spectrum after it is spread due to the instability (phase noise) of the system oscillators.

Target detection is usually performed in several stages; in its simplest form, detection is the determination of whether the RF entering the radar receiver is the result of clutter reflection or the combined return of clutter and echoes from a target of interest. Echoes received from a possible target generally contain clutter as well as the target information. The radar receiver and signal processor are designed to maximize the target return and minimize the clutter, resulting in a Signal-to-Clutter Ratio (SCR) suitable for the target of interest.

Figure 2:
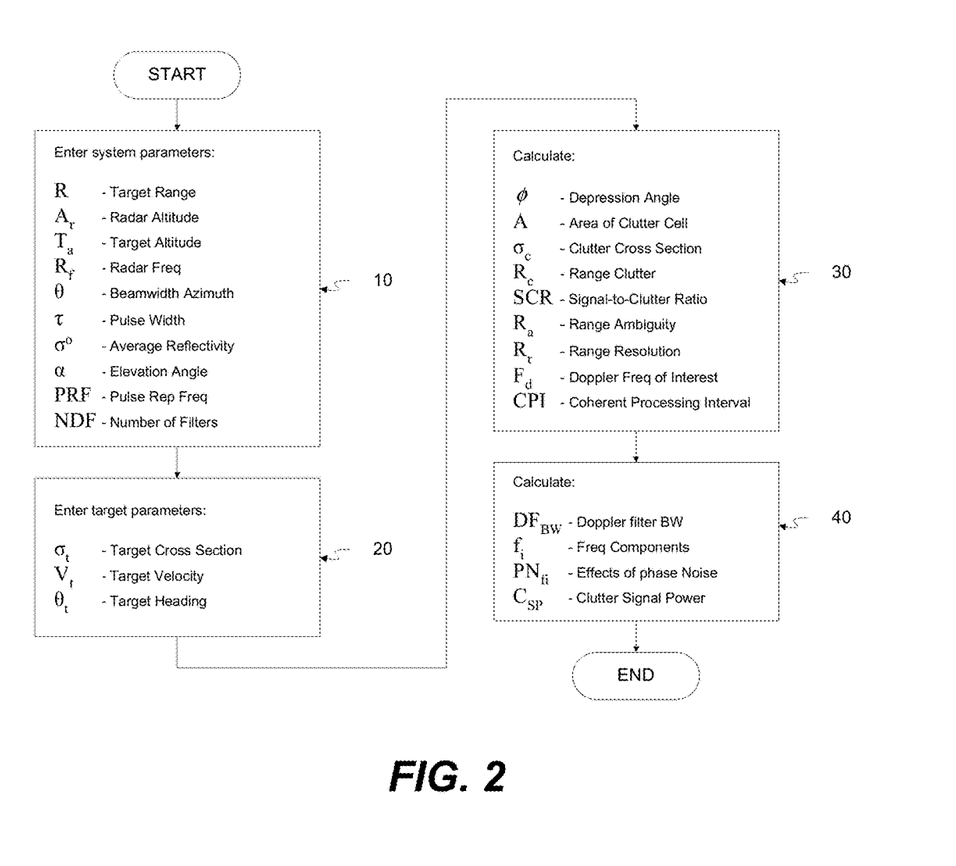
FIG. 2 shows a flow chart of parameters and computational actions within the computer simulation.

Referring to FIG. 2, a stage 30 in a method to obtain information about a target as reflected in an RF signal involves calculation of the SCR. SCR is the ratio of the power received from target to power received from clutter; dividing the received powers results in co-located target and clutter. SCR can also be defined as the ratio of radar cross section of the target, entered or otherwise obtained in stage 20 (designated $\sigma_t$), to clutter cross section, calculated or otherwise determined in stage 30 (designated $\sigma_c$):

$$SCR = \frac{\sigma_t}{\sigma_c}$$

In certain instances, this can be normalized by assuming a radar cross section of target of 1 m². The clutter cross section calculated in stage 30 is normally defined as the product of the average reflectivity, entered or otherwise obtained in stage 10 (designated $\sigma^o$), and the area of the clutter cell, calculated or otherwise determined in stage 30 (designated A):

$$\sigma_c = A * \sigma^o$$

For an airborne radar system looking down at targets above a surface, for example, a floor of a desert, using a simple pulse, the area (A) could be defined as:

$$A = \frac{(R_t * \theta) * (C * \tau)}{2} * \operatorname{Sec}(\phi)$$

where the target range is entered or otherwise obtained in stage 10 (designated $R_t$), the azimuth beam width is entered or otherwise obtained in stage 10 (designated $\theta$), the pulse width is entered or otherwise obtained in stage 10 (designated $\tau$) and the depression angle is calculated or otherwise determined in stage 30 (designated $\phi$) comprise the variables which determine this value of A along with C (the speed of light, generally considered a constant at $3 \times 10^8$ m/s).

Provided with a hypothetical target range (R) of 180 miles with an altitude of ($T_a$) 10,000 ft. and the radar platform ($R_a$) at 35,000 ft., the signal to clutter ratio can be calculated. The radar systems parameters may be as follows:

TABLE 1

| Radar System Parameters | |
|---|---|
| $\sigma_t$ | 1.0 m² |
| $\sigma^o$ | 0.01 |
| $\tau$ | 1.40 µs |
| R | 289,682 meters |
| $\phi$ | 0.0174533 radian |
| $T_a$ | 3048 meters |
| $R_a$ | 10668 meters |
| Pulses in CPI | 64 |
| PRF | 30 KHz |

The depression angle 30, as an initial calculation, is typically defined as:

$$\phi = \sin^{-1}\left(\frac{R_a - T_a}{R_t}\right)$$

and is calculated from the target range (from stage 10), radar platform altitude entered or otherwise obtained in stage 10 (designated $A_r$), and the target altitude entered or otherwise obtained in stage 10.

Using this formula, the SCR, ratio of the power received from target to power received from clutter, can be calculated as follows:

$$SCR = \frac{\sigma_t}{\frac{\sigma^\circ * (R*\theta)*(C*\tau)}{2} * \text{Sec}(\phi)}$$

Figure 3:
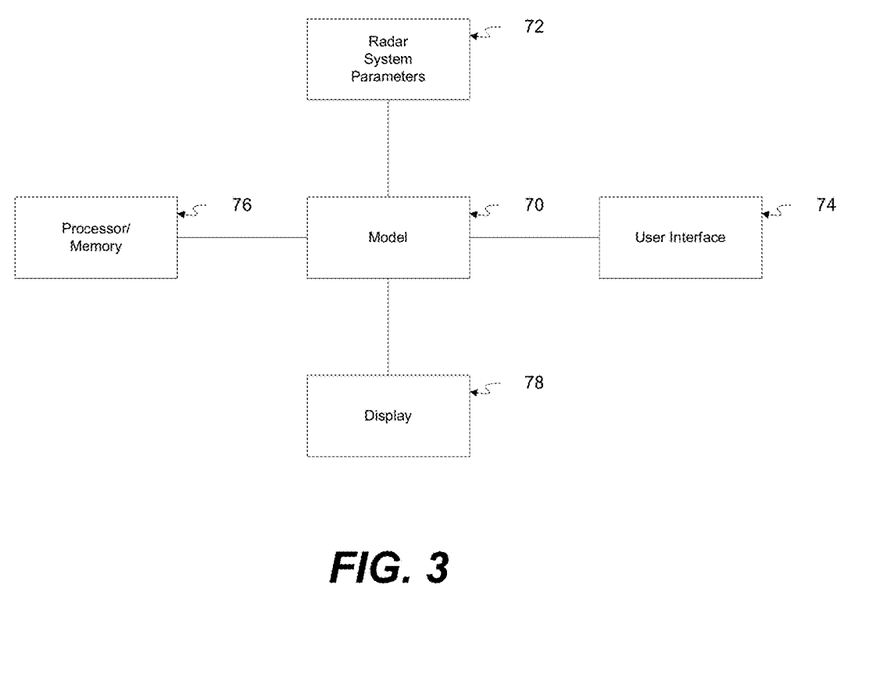
FIG. 3 is a schematic showing an application of the method in accordance with the invention for generating a model of a radar system performance and displaying the model to a radar operator.

When a variable is referred to herein be as being entered, it means that a computer or other processing unit 76 is programmed to execute the method shown in FIG. 2 when coupled to a radar system parameters 72, and the variables are being entered via one or more user interfaces 74 associated with the model 70 (see FIG. 3). Similarly, when a variable is referred to herein as being calculated, the processing unit 76 is executing an algorithm to perform this calculation, using electronic software and/or hardware in a manner known to those skilled in the art. The algorithm is stored in memory accessible to the processing unit 76, e.g., on computer readable storage media 76.

Finally, the model generated by the method may be displayed on a display 78 associated with the processing unit 76 to enable the radar operator to view it and understand the limitations of the radar system, 72. This visual presentation of the model may be made on any display coupled to the processing unit 76, as well as on multiple displays or stored in memory for later display on a display, sent to the cloud, transmitted to a remote location using a wireless network, and other transmission schemes. The model is thus reduced to a physical form whenever displayed. It can also be printed out, and thus also reduced to physical form.

Since the clutter amplitude dominates that of the target (see FIG. 1), the target cannot be detected. On average, the target value usually exceeds the clutter value by 20 dB or more for robust probability of detection.

Using Doppler processing, it is possible to separate the target from the clutter in the frequency domain. Ideally, there would be no clutter signal in the target Doppler filter. However, several effect cause the spread the spectrum of the clutter, including slight motion of the clutter, antenna scanning, platform motion, spectral side lobes associated with the FFT process, and phase noise.

Phase noise of a typical oscillator configuration is somewhat predictable, however specific values are not. They are oscillator-dependent, so the specifications for the particular oscillator of interest must be used. Analysis of a typical oscillator circuit reveals that there will be a low frequency region in which the phase noise power falls off as $1/f^3$, and a region farther from the carrier that falls off as $1/f^2$, before the phase noise reaches a noise floor. A simple mathematical model that can be used to approximate the power spectral density of such an oscillator is:

$$s(f) = 10\log_{10}\left[\left[10^9\left(\frac{s_{1k}}{f^3} + \frac{2.5s_{50K}}{f^2}\right)\right] + s_{min}\right]$$

For a range-ambiguous system, it is not only the co-located clutter that competes with the target, but also clutter that is in several ambiguous range intervals which are closer than the target. These closer clutter cells will experience a lower space loss (the R4 term) than the target, making them a significant interference signal; actually worse than the co-located clutter. Of course, only the clutter that is in the beam (including side lobes) will be seen. Each value of radar pulse repetition frequency (PRF) will move these range-ambiguous cells around, so only a point calculation is given.

Range folding will have a drastic effect on the calculated SCR. With a target below the radar platform, looking downward with a beam elevation (the elevation angle $\alpha$ being entered or otherwise obtained in stage 10) results in clutter range $R_c$ calculated or otherwise obtained in stage 30 defined by:

$$R_c = \frac{R_a}{\sin\left(\frac{\alpha}{2} + \phi\right)}$$

If the target and clutter are not co-located, the equation for SCR is preferably modified to compensate for the clutter range calculated in stage 30 and target range entered in stage 10. The non-co-located SCR calculated or determined obtained in stage 30 becomes:

$$SCR = \frac{\sigma_t}{\sigma_c}\frac{R_c^4}{R_t^4}$$

to adjust for the difference in ranges.

The clutter effect affects target detection when phase noise is considered. Since the clutter is into the folded ranges, the SCR is preferably also modified to compensate for these ranges. The folded range SCR calculated or otherwise determined in stage 30 becomes:

$$SCR = \frac{\sigma_t}{R_t^4} \bigg/ \sum \frac{\sigma_c}{R_c^4}$$

The range ambiguity calculated or otherwise determined in stage 30 then becomes:

$$R_a = \frac{C * \frac{1}{PRF}}{2}$$

based on the pulse repetition frequency PRF entered or otherwise obtained in stage 10. Range resolution, calculated or otherwise determined in stage 30, becomes:

$$R_r = \frac{C * \tau}{2}$$

The effects of spectral spreading due to phase noise rely, in part, on how much of the signal is detected with the phase noise contribution in the Doppler filter of the target. The Doppler frequency of interest is calculated or otherwise determined in stage 40 from:

$$F_d = \frac{2 * V_t * \cos(\theta_t) * R_f}{C}$$

wherein the target velocity is entered or otherwise obtained in stage 20, the target heading is entered or otherwise obtained in stage 20 and the radar frequency entered or otherwise obtained in stage 10, these being the variables which enable the value of the Doppler frequency of interest to be calculated. The calculations in stage 40 may occur simultaneous with the calculations in stage 30 or thereafter, or in any order that is possible with the entered parameters in stages 10 and 20 (which themselves may be entered in any order).

The level of the phase noise at the Doppler frequency of interest calculated in stage 40 is multiplied by the bandwidth of the Doppler filter. The Doppler filter bandwidth calculated or otherwise determined in stage 40 is the reciprocal of the Coherent Processing Interval (CPI), times the increase due to weighting, assigned a nominal value of 1.3:

$$DF_{BW} = 1.3 * \frac{1}{CPI}$$

The CPI is calculated or otherwise determined in stage 30 and is the number of Doppler filters entered or otherwise obtained in stage 10 divided by the PRF entered or otherwise obtained in stage 10 for the range ambiguous targets.

In addition to the phase noise which is naturally in the Doppler filter of interest, all of the folded (aliased) frequency components of the phase noise that fall into that filter must be identified. This requires that all of the frequency components calculated or otherwise determined in stage 40 at each multiple of the PRF entered in stage 10 from the first interval to the receiver bandwidth (which is assumed to be about $1/\tau$) to be identified. This results in:

$$f_i = |F_d \pm n * PRF|$$
$$n = 0, 1, \ldots, m;$$
$$|F_d \pm m * PRF| \leq \frac{1}{\tau}$$

In order to obtain a value that represents how much of the clutter signal power gets through the Doppler filter of interest calculated in stage 30, the phase noise entered or otherwise obtained in stage 40 for each frequency component $f_i$ calculated in stage 40 is multiplied by the Doppler filter bandwidth calculated in stage 40 and summed for all iterations resulting in a final phase noise value, in stage 40, of:

$$PN = \sum_{i=0}^{m} PN_{f_i} * DF_{BW}$$

Since the carrier offsets entered for the phase noise in stage 40 will not coincide with each frequency component $f_i$ calculated in stage 40, the phase noise is assumed to have a linear relationship between each offset point.

Once the effects of phase noise are calculated, it is possible to display correlation between an effective distance of a target detection by the radar system and phase noise. For example, it is possible to display a graph of the change in the detection range by the radar system and the degradation in the phase noise. This will provide the radar operator, after viewing the display graph on a display associated with, proximate and/or coupled to the radar system, with the ability to see the limitations of the radar system. The radar operator can then take appropriate action knowing that the radar system is not providing effective tracking and detection of targets, as a result of phase noise.

Figure 4:
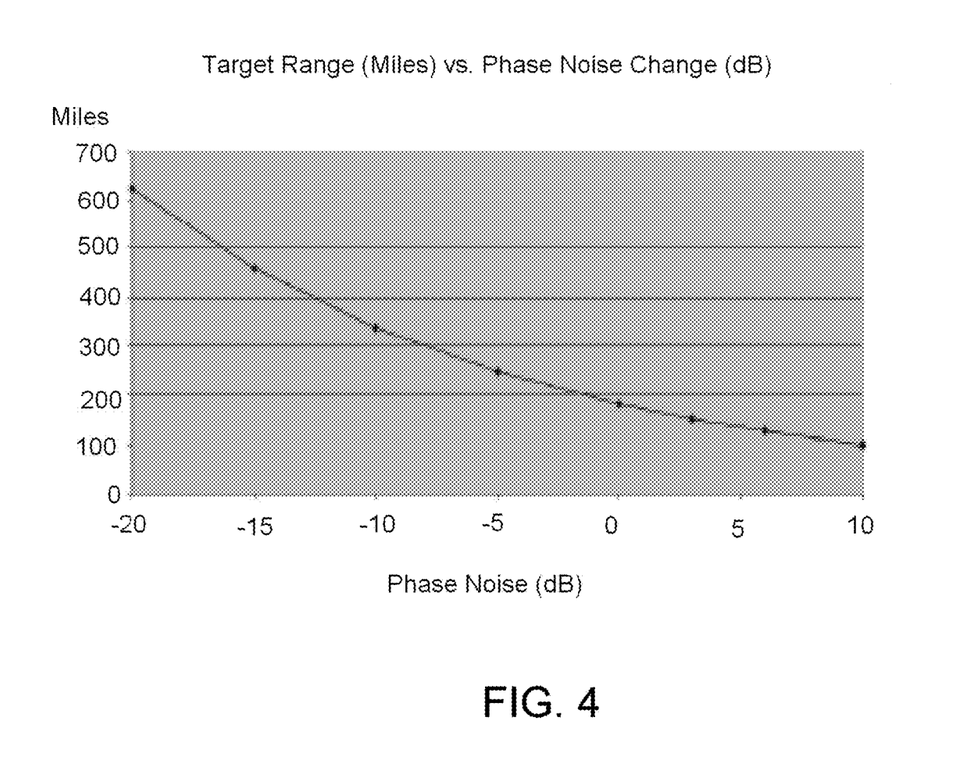
FIG. 4 is a graph showing a change in the detection range versus the degradation in the phase noise.

To analyze the phase noise effects, it is possible to maintain the residual SCR to 20 dB and plot the change in the detection range versus the degradation in the phase noise, as shown in FIG. 4. It is seen that as the phase noise increases, the range at which a target can be detected is reduced. For the total of 6 dB of phase noise increase implemented, the detection range reduces from 180 miles to about 125.5 miles.

If radar systems had extremely low phase noise, the effects of spectral spreading on the clutter return would be negligible. In this scenario, the clutter return spectrum resides almost entirely in the Doppler Filters near zero (see FIG. 1, Target Return in Clutter, Doppler filter bins −PRF/2 through +PRF/2). Stationary clutter returns are easily separated from moving target returns and robust target detection would be expected. The target ranges that produce a residual SCR of 20 dB are extremely long and the theoretical target detection would likely far exceed what is observed in a practical operating radar system.

One practical limitation would likely be the curvature of the earth. For an airborne radar at about 35,000 feet targets beyond about 351 miles must be at increasingly higher altitude in order to remain in the radar line-of-sight. Assuming a flat earth and acknowledging that the receiver thermal noise would limit detection to a much closer range, the phase-noise-limited range would be about 625.2 miles when phase noise is decreased by about 20 dB across the board, as seen in FIG. 4.

Modeling the effects of phase noise on target detection provides a means of predicting the performance of Doppler surveillance radar in a clutter environment. The model presented can be used to analyze the radar system design and to predict the impact phase noise will have in various clutter environments. The model allows analysis beyond simply calculating the receiver thermal noise and shows how detection of a target is impacted by the phase noise and the competing clutter signal. It provides a means of quantifying the impact of phase noise by analyzing the clutter spectral spread into the target Doppler filter of interest. The example described above evidences the method of analysis and the loss of target detectable range by an increase of the system phase noise. The model detailed is a single point calculation, but describes the method for performing a comprehensive analysis of the phase noise impact on the surveillance radar.

Figure 5:
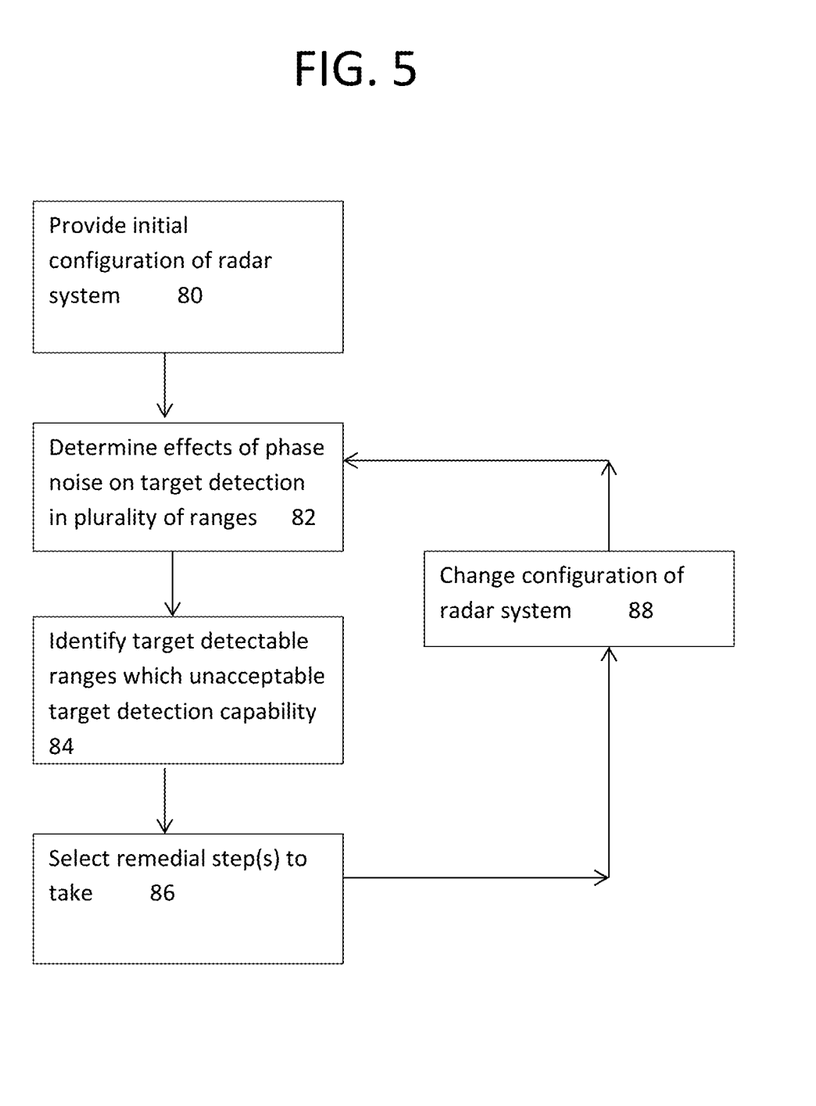
FIG. 5 is a flow chart showing the manner in which a method in accordance with the invention is applicable in practice.

Referring now to FIG. 5, a method for designing a pulse Doppler radar detection system therefore entails configuring the components of the radar system for target detection, such components including but not limited to any known set of hardware components that are necessary to cause transmission of radar waves, reception of the radar waves after having been reflected off of objects and processing of the received radar waves into targets on a display screen (step 80).

Such component sets are known to those skilled in the art to which this invention pertains and includes those mentioned herein. The invention is not limited to any defined set and any generic or specialized pulse Doppler radar system may be used. Basic components may therefore include a frequency generator or oscillator, a frequency scanning antenna, a receiver configured to receive clutter and signals from a target and a signal processor that utilizes a plurality of Doppler filters.

Then, the effect of phase noise on target detection is analyzed using the techniques disclosed above (step 82). This involves application of the techniques above which may be effected using a processing unit, and the other hardware and/or software components described above. As used herein, a processing unit may comprise one or more processors. If multiple processors are provided, then they can perform individual functions.

Based on the application of the phase noise effect techniques on target detection, target detectable ranges with unacceptable target detection capability are identified in step 84. There may be one or more such target detectable ranges that are not acceptable for use, i.e., the extent of signal clutter renders the ability to detect a target in the range suspect and thus unreliable.

Once the target detectable ranges that cannot be effectively used are identified, the radar operator is able to take remedial steps, step 86. This involves any one of a number of different options. First, one or more better phase noise floors may be obtained, e.g., by using a better or different oscillator or other hardware variations to thereby generally change the configuration of the radar system, step 88. Once the configuration of the radar system is changed, the process may return to the step of analyzing the effect of phase noise on target detection using the new configuration of the radar system. If the effect is reduced with the new configuration, the new configuration may be implemented in practice.

Another remedial step is to provide instructions about limits of the use of the radar system, i.e., indicating that the radar system is unreliable in one or more of the target detectable ranges. This may allow the user to use a different radar system.

The process of analyzing the phase noise effect on the pulse Doppler radar system may continue until a satisfactory detectable range is obtained.

As such, the invention also encompasses a method for designing a radar system when a plurality of radar system components are available. In such a method, one configuration of the radar components would be assembled to provide an operative radar system, and then this initial radar system would be analyzed to determine the limits of the acceptable detectable ranges, i.e., the location and size of target detectable ranges lost due to clutter in the manner described above. If the initial system has too many non-detectable target ranges and/or overly broad non-detectable target ranges, one or more of the components of the initial system are removed and replaced by a different component with different capabilities. The substitute component may have different properties relating to wave propagation, wave processing, or any other property or condition that will cause a change in the operation of the radar system.

The first iteration of the radar system is then again subjected to an analysis as to the limits of the acceptable detectable ranges thereof in the manner described above. If the first iteration has too many non-detectable target ranges and/or overly broad non-detectable target ranges, one or more of the components of this system are removed and replaced by a different component with different capabilities. The substitute component will obviously not be the same as one of the original components of the system and would have a different property or condition that will cause a change in the operation of the radar system.

The second iteration of the radar system is then analyzed for its signal to noise clutter ration, and this process of substituting one or more components, then performing the analysis and ascertaining if the radar system is operationally acceptable continues until an optimum radar system configuration is obtained.

Another use of the model derivation technique described above is to determine operating parameters of an existing Doppler radar system. The model derivation technique is useful to provide users and/or maintainers of existing radar systems with phase specifications that outline suitable operating conditions for the radar system and enable the users and maintainers to recognize the limitations of the radar system and more importantly, to operate the radar system with an understanding of the specifications that are critical to achieve the desired operational performance. Although particularly useful for assessing performance of an existing radar system, this technique may be equally used for a newly designed radar system.

To this end, a method in accordance with the invention includes generating a respective model of the effect of phase noise during use of the radar system as according to any of the techniques described herein in a plurality of different theatres of operation of the (existing) radar system, e.g., rolling hills, desert, heavily wooded forest, sea, and the like. From the respective models, system phase noise specifications to achieve predetermined target detection distance criteria for each theatre are determined. Different theatres of operation of the radar system are likely to have different phase noise specifications and the user of the radar system should be apprised of the different phase noise specifications to understand the limitations on the effective operation of the radar system in each different theatre.

Finally, once the phase noise specifications for the different theatres are derived, e.g., by a processing unit as disclosed above, the user is notified of the phase noise specifications on a presentation device, e.g., a visual display. The phase noise specifications may be stored in a memory device in associated with the specific theatre so that when the user wants to use the radar system for a specific theatre, they identify the theatre to the processing unit and the processing unit retrieves the appropriate phase noise specifications from the memory component. Generally then, the derived or determined system phase noise specifications are conveyed to a user or maintainer of the radar system using a presentation device which may be a display, sound-generating apparatus and the like.

The disclosure in U.S. Pat. No. 4,891,649 (Labaar et al.) and U.S. Pat. No. 6,809,681 (Niechayev) is incorporated by reference herein. The present invention may be used with the techniques, disclosed in these patents to the extent possible, which would be understood by those skilled in the art to which the invention pertains. Accordingly, the invention may be part of a method for processing a radar return signal in a radar system in which a radar modulation signal is employed to estimate the range and velocity of a target, and in a pulsed Doppler radar system of the type having a modulation signal and means for estimating the target signal power in each of an array of target range and velocity cells organized according to target signal time delay and Doppler frequency shift (see Niechayev). The invention may also be used in a pulse type radar system and a method for quantifying and enabling suppression of electronic phase noise contained within RF pulse signals received at an RF receiver of a transmitter and receiver system with the receiver containing IF amplifiers for amplifying signals of an IF frequency, which RF pulse signals originate in and are propagated from the transmitter (see Labaar et al.).

Having thus described a few particular embodiments of the invention, various alterations, modifications, and improvements will readily occur to those skilled in the art. Such alterations, modifications and improvements as are made obvious by this disclosure are intended to be part of this description though not expressly stated herein, and are intended to be within the spirit and scope of the invention. Accordingly, the foregoing description is by way of example only, and is not limiting. The invention is limited only as defined in the claims and equivalents thereto.

The invention claimed is:

1. A method for designing a Doppler radar system, comprising:
   configuring a first set of components that enable operation of the Doppler radar system;
   generating a first model of effect of phase noise during operation of the Doppler radar system configured with the first set of the components by:
      calculating, using a processor, an initial signal-to-clutter ratio (SCR) representing a ratio of power received from echoes from a target by the Doppler radar system to power resulting from clutter reflection received by the Doppler radar system;
      modifying, using a processing unit, the initially calculated SCR as a function of a range ambiguity and range resolution; and
      calculating, using the processing unit, a Doppler frequency of interest based on velocity of a target, target heading and radar frequency, a Doppler filter bandwidth, frequency components, and a measure of clutter signal passing through a Doppler filter of interest by summing products of the phase noise for each frequency by the Doppler filter bandwidth;
   changing the Doppler radar system by configuring a second set of the components that enable operation of the Doppler radar system, which second set of components is different than the first set of components;
   generating a second model of the effect of phase noise during operation of the Doppler radar system configured with the second set of the components by:
      calculating, using a processor, an initial signal-to-clutter ratio (SCR) representing a ratio of power received from echoes from a target by the Doppler radar system to power resulting from clutter reflection received by the Doppler radar system;
      modifying, using a processing unit, the initially calculated SCR as a function of a range ambiguity and range resolution; and
      calculating, using the processing unit, a Doppler frequency of interest based on velocity of a target, target heading and radar frequency, a Doppler filter bandwidth, frequency components, and a measure of clutter signal passing through a Doppler filter of interest by summing products of the phase noise for each frequency by the Doppler filter bandwidth;
   analyzing the first and second models to determine which of the first and second sets of components has a lower effect of phase noise during operation of the Doppler radar system; and
   operating the Doppler radar system with the first or second set of components depending on the analysis of which of the first and second models has a lower effect of phase noise during operation of the Doppler radar system.

2. The method of claim 1, further comprising, when generating the first model of the effect of phase noise during operation of the Doppler radar system configured with the first set of the components or generating the second model of the effect of phase noise during operation of the Doppler radar system configured with the second set of the components, modifying the SCR, using the processing unit, to compensate for clutter range and target range for situations when the target and clutter ranges are not co-located.

3. The method of claim 1, further comprising, when generating the first model of the effect of phase noise during operation of the Doppler radar system configured with the first set of the components or generating the second model of the effect of phase noise during operation of the Doppler radar system configured with the second set of the components, modifying the SCR, using the processing unit, to compensate for folded ranges of the clutter reflection.

4. The method of claim 1, further comprising, when generating the first model of the effect of phase noise during operation of the Doppler radar system configured with the first set of the components or generating the second model of the effect of phase noise during operation of the Doppler radar system configured with the second set of the components, deriving, using the processing unit, the first or second model from the calculated measure of clutter signal passing through the Doppler filter of interest.

5. The method of claim 4, further comprising visually presenting the derived first or second model on a display coupled to the processing unit.

6. The method of claim 1, wherein the first or second model is generated such that phase noise is a variable which when applied to the Doppler radar system parameters, yields impact of phase noise on the Doppler radar system's target detection.

7. The method of claim 1, wherein the first or second model is generated such that phase noise and the clutter environment are variables which when applied to the Doppler radar system parameters, yields impact of phase noise on the Doppler radar system's target detection.

8. The method of claim 1, further comprising:
   identifying a plurality of the components required for operation of the Doppler radar system; and
   obtaining a plurality of at least one of the identified components, each of the plurality of the at least one of the identified components having the same function but interacting with the remaining components to provide a different operation of the Doppler radar system.

9. The method of claim 8, wherein the step of obtaining a plurality of at least one of the identified components comprises obtaining a plurality of each of the identified components.

10. The method of claim 8, wherein the step of obtaining a plurality of at least one of the identified components comprises obtaining first and second oscillators, the first set of components includes the first oscillator, the step of changing the Doppler radar system by configuring a second set of the components that enable operation of the Doppler radar system comprises replacing the first oscillator with the second oscillator which is thus part of the second set of components.

11. The method of claim 1, further comprising:
   changing the Doppler radar system configured with the second set of components by configuring a third set of the components that enable operation of the Doppler radar system, which third set of components is different than the first and second sets of components;

generating a third model of the effect of phase noise during operation of the Doppler radar system configured with the third set of the components by:
  calculating, using a processor, an initial signal-to-clutter ratio (SCR) representing a ratio of power received from echoes from a target by the Doppler radar system to power resulting from clutter reflection received by the Doppler radar system;
  modifying, using a processing unit, the initially calculated SCR as a function of a range ambiguity and range resolution; and
  calculating, using the processing unit, a Doppler frequency of interest based on velocity of a target, target heading and radar frequency, a Doppler filter bandwidth, frequency components, and a measure of clutter signal passing through a Doppler filter of interest by summing products of the phase noise for each frequency by the Doppler filter bandwidth;
analyzing the first, second and third models to determine which of the first, second and third sets of components has a lower effect of phase noise during operation of the Doppler radar system; and
operating the Doppler radar system with the first, second or third set of components depending on the analysis of which of the first, second and third models has a lower effect of phase noise during operation of the Doppler radar system.

12. The method of claim 1, wherein each of the first and second sets of components includes a frequency generator or oscillator, a frequency scanning antenna, a receiver configured to receive clutter and signals from a target and a signal processor that utilizes a plurality of Doppler filters.

13. A method for designing a Doppler radar system, comprising:
configuring a plurality of sets of components that enable operation of the Doppler radar system, each set being different from other sets;
generating a respective model of effect of phase noise during operation of the Doppler radar system configured with each set of the components by:
  calculating, using a processor, an initial signal-to-clutter ratio (SCR) representing a ratio of power received from echoes from a target by the Doppler radar system to power resulting from clutter reflection received by the Doppler radar system;
  modifying, using a processing unit, the initially calculated SCR as a function of a range ambiguity and range resolution; and
  calculating, using the processing unit, a Doppler frequency of interest based on velocity of a target, target heading and radar frequency, a Doppler filter bandwidth, frequency components, and a measure of clutter signal passing through a Doppler filter of interest by summing products of the phase noise for each frequency by the Doppler filter bandwidth;
analyzing the respective models to determine which set of components has a lower effect of phase noise during operation of the Doppler radar system; and
operating the Doppler radar system with the set of components depending on the analysis of which of the respective models has a lower effect of phase noise during operation of the Doppler radar system.

14. The method of claim 13, further comprising:
identifying a plurality of the components required for operation of the Doppler radar system; and
obtaining a plurality of at least one of the identified components, each of the plurality of the at least one of the identified components having the same function but interacting with the remaining components to provide a different operation of the Doppler radar system.

15. A method for optimizing operation of a Doppler radar system based on a theatre of operation, comprising:
generating a respective model of effect of phase noise during operation of the Doppler radar system in a plurality of different theatres of operation by, for each theatre of operation:
  calculating, using a processor, an initial signal-to-clutter ratio (SCR) representing a ratio of power received from echoes from a target by the Doppler radar system to power resulting from clutter reflection received by the Doppler radar system;
  modifying, using a processing unit, the initially calculated SCR as a function of a range ambiguity and range resolution; and
  calculating, using the processing unit, a Doppler frequency of interest based on velocity of a target, target heading and radar frequency, a Doppler filter bandwidth, frequency components, and a measure of clutter signal passing through a Doppler filter of interest by summing products of the phase noise for each frequency by the Doppler filter bandwidth; then
deriving from the respective models, system phase noise specifications for each theatre to achieve predetermined target detection distance criteria;
conveying using a presentation device, the derived system phase noise specifications to an operator or maintainer of the Doppler radar system; and
operating the Doppler radar system in each of the plurality of different theatres of operation in accordance with the theatre-specific system phase noise specifications.

16. The method of claim 15, further comprising:
identifying a plurality of the components required for operation of the Doppler radar system; and
obtaining a plurality of at least one of the identified components, each of the plurality of the at least one of the identified components having the same function but interacting with the remaining components to provide a different operation of the Doppler radar system.

17. A scanning radar system, comprising:
an initial set of components including:
  a frequency generator or oscillator,
  a frequency scanning antenna,
  a receiver configured to receive clutter and signals from a target, and
  a signal processor that utilizes a plurality of Doppler filters, the signals from the target being situated in one of the Doppler filters dependent on a velocity of the target, said receiver being further configured to apply a quantified effect of the clutter on the one of the Doppler filters and provide an indication of reliability of determination of the target being situated in the one of the Doppler filters based on the clutter quantified effect, said receiver quantifying the effect of the clutter in the Doppler filters by summing products of phase noise for each Doppler filter by the Doppler filter bandwidth; and
at least one additional component selected from a group consisting of a frequency generator or oscillator, a frequency scanning antenna, a receiver and a signal processor, said at least one additional component being a substitute for the respective component in said initial set of components when the indication of the reliability of the determination of the target being situated in the one of the Doppler filters provided by said receiver when the scanning radar system includes said initial set of components is that the determination of the target being situated in the one of the Doppler filters is not reliable, and the scanning radar system being operated with said at least one additional component and remaining components of said initial set of components to thereby constitute a second set of components when the indication of the reliability of the determination of the target being situated in the one of the Doppler filters provided by said receiver when the scanning radar system includes said initial set of components is that the determination of the target being situated in the one of the Doppler filters is not reliable.

18. The system of claim 17, wherein said receiver of said initial set of components comprises signal processing componentry that derives data indicative of movement of the target, further comprising a display system that displays indicated movement of the target.

19. A method for designing a Doppler radar system, comprising:
  configuring a plurality of sets of components that enable operation of the Doppler radar system, each set being different from other sets;
  generating a respective model of effect of phase noise during operation of the Doppler radar system configured with each set of the components by:
    calculating, using a processor, an initial signal-to-clutter ratio (SCR) representing a ratio of power received from echoes from a target by the Doppler radar system to power resulting from clutter reflection received by the Doppler radar system;
    modifying, using a processing unit, the initially calculated SCR as a function of a range ambiguity and range resolution; and
    calculating, using the processing unit, a Doppler frequency of interest based on velocity of a target, target heading and radar frequency, a Doppler filter bandwidth, frequency components, and a measure of clutter signal passing through a Doppler filter of interest by summing products of the phase noise for each frequency by the Doppler filter bandwidth;
  analyzing the respective models to determine which set of components has a lower effect of phase noise during operation of the Doppler radar system; and
  operating the Doppler radar system with one of the sets of components depending on the analysis of which of the respective models has a lower effect of phase noise during operation of the Doppler radar system.

20. The method of claim 19, further comprising:
identifying a plurality of the components required for operation of the scanning radar system; and
obtaining a plurality of at least one of the identified components, each of the plurality of the at least one of the identified components having the same function but interacting with the remaining components to provide a different operation of the Doppler radar system.

* * * * *